United States Patent [19]

Lafon et al.

[11] Patent Number: 5,071,827
[45] Date of Patent: Dec. 10, 1991

[54] PRODUCTION OF SUPERCONDUCTOR MATERIALS

[75] Inventors: Marie-Odile Lafon; Claude Magnier, both of Paris, France

[73] Assignee: Rhone-Poulenc Chimie, Courbevoie, France

[21] Appl. No.: 245,902

[22] Filed: Sep. 19, 1988

[30] Foreign Application Priority Data

Sep. 18, 1987 [FR] France .................................. 87 12935

[51] Int. Cl.$^5$ ............................................. C01F 11/02
[52] U.S. Cl. ........................................ 505/1; 505/757; 505/780
[58] Field of Search .................... 505/1, 735, 737, 738, 505/780

[56] References Cited

U.S. PATENT DOCUMENTS 4,257,339  3/1981  Prudhon et al. .
4,696,810  9/1987  Shirasaki et al. .
4,863,521  9/1989  Block .
4,874,598  10/1989  Oda et al. .
4,898,851  2/1990  Michel .

FOREIGN PATENT DOCUMENTS 0122665  10/1984  European Pat. Off. .
2017523  10/1979  United Kingdom .
WO8810235  12/1988  World Int. Prop. O. .

OTHER PUBLICATIONS

Syono et al., "X-Ray Electron Microscopic Study of a High Tc Superconductor $Y_{0.4}Ba_{0.6}CuO_{2.22}$", Japanese Jrnl. Appl. Phys., vol. 26, No. 4, Apr. 1987, pp. L498–L501.
Proceedings of the 18th International Conference on Low Temperature Physics, "Superconducting Properties For La-Sr-Cu-O Systems", Part 1 Contributed Papers, Kyoto, Japan, Aug. 20–26, 1987, pp. 1059–1060.
"Synthesis of Superconducting Y-Ba-Cu-O Powder by the Spray Drying Method", M. Awano et al., 1988, pp. 426–432.
"A Hydroxycarbonate Route to Superconductor Precursor Powders", J. A. Voigt et al., High Temperature Superconductors, Extended Abstracts, Proceedings of Symposium S 1987 Spring Meeting of the Materials Research Society, Apr. 1987, vol. 99, 1988, pp. 635–638.
"Thermal Stability of Superconducting $YBa_2Cu_3O_{9-x}$ in Different Environments", K. Swaminathan et al., Materials Letters, vol. 6, No. 8.9, May 1988, pp. 261–264.
"Magnetic and Electric Properties of YBCO Ceramics Prepared by Coprecipitation Method", Y. Yoshisato et al., Nippon-Seramikkusu-Kyokai-Gakujutsu-Ronbunshi, 1988, pp. 459–462.
Abstract entitled, "Magnetic and Electric Properties of YBCO Ceramics Prepared by Coprecipitation Method", Y. Yoshisato et al., Apr. 1988, Seramikkusu Kyokai Gakujutsu Ronbunshi.
"High Tc Superconducting Thin Films by Chemical Spray Deposition", International Journal of Modern Physics B, vol. I, No. 2, 579–582, 1987.
Chemical Engineers' Handbook, Perry et al.,
McGraw-Hill Book Company, 1963, pp. 20-57 to 20-71.
"Fabrication, Mechanical Properties, Heat Capacity, Oxygen Diffusion, and the Effects of Alkali Earth Ion Substitution on High $T_c$ Superconductors", G. W. Crabtree et al., Advanced Ceramic Materials—Ceramic Superconductors, Jul. 1987, vol. 2, No. 3B, Westerville, Ohio, pp. 444–456.
"Increased Transition Temperatures in $YBa_2Cu_3O_y$ Superconducting Ceramics by Exposure to Nitrogen", D. N. Matthews et al., Nature, vol. 328, Aug. 1987, pp. 786–787.
"Phase Diagram of the $(LaAlO_3)_{1-x}(SrTiO_3)_x$ Solid-Solution System, for $x<0.8$", J. G. Bednorz et al., Mat. Res. Bull., vol. 18, 1983, pp. 181–187.
"Oxalate Precipitation Methods for Preparing the Yttrium-Barium-Copper Superconducting Compound", Clark et al., High Temperature Superconductors Symposium held Nov. 30–Dec. 4, 1987, Mats. Res. Soc. 1988, pp. 153–158.
"High $T_c$ Superconductivity of La-Ba-Cu Oxides", Uchida et al., Japanese Journal of Applied Physics, vol. 26, No. 1, Jan. 1987, pp. L1–L2.
"Preparation of a High-Tc Y-Ba-Cu-O Superconductor Using Colloidal Methods", M. Fujiki et al., Japanese Journal of Applied Physics, vol. 26, No. 7, Jul. 1987, pp. L1159–L1160.
"Possible High Tc Superconductivity in the Ba-La-Cu-O System", J. G. Bednorz et al., Z. Phys. B-Condensed Matter 64, 1986, pp. 189–193.
"On the Coprecipitation Method for the Preparation of High Tc M-X-Cu-O (M=Ba, Sr, X=La, Y) System", K. Kaneko et al., Japanese Journal of Applied Physics, vol. 26, No. 5, May 1987, pp. L734–L735.
"Superconductivity and the Tailoring of Lattice Parameters of the Compound $YBa_2Cu_3O_x$", Chen et al., Advanced Ceramic Materials—Ceramic Superconductors, Jul. 1987, vol. 2, No. 3B, Westerville, OH, pp. 457–470.
"Preparation of High-Tc Superconducting Oxides by the Amorphous Citrate Process", Chung-Tse Chu and Bruce Dunn, Journal of the American Ceramic Society, vol. 70, No. 12, Dec. 1987, pp. C375–C377.

Primary Examiner—William R. Dixon, Jr.
Assistant Examiner—Chris Gallo
Attorney, Agent, or Firm—Burns, Doane, Swecker & Mathis

[57] ABSTRACT

Finely divided, homogeneous and easily sintered superconducting powders of at least one rare earth element, e.g., yttrium and/or lanthanum, at least one alkaline earth metal, e.g., barium, calcium and/or strontium, and at least one transition metal, e.g., copper, nickel, manganese, cobalt and/or iron, and oxygen, are produced by (a) intimately admixing a sol of a rare earth element and an aqueous solution of at least one alkaline earth metal nitrate and of at least one nitrate of a transition metal, with the pH of the resulting mixture being adjusted to a value such that said nitrates remain solubilized therein; (b) drying the resulting mixture; (c) calcining the dried product; and, optionally; (d) grinding the calcined material.

27 Claims, No Drawings

PRODUCTION OF SUPERCONDUCTOR MATERIALS

CROSS-REFERENCE TO COMPANION APPLICATIONS

Our copending applications, Ser. No. 07,245,903 and Ser. No. 07,245,901 both filed concurrently herewith and both assigned to the assignee hereof.

BACKGROUND OF THE INVENTION

1. Field of the Invention

The present invention relates to the production of superconductor materials.

2. Description of the Prior Art

It is known to this art that, in theory, when superconductors are cooled to very low temperatures, they offer no resistance to the flow of an electric current.

Until somewhat recently, the state of superconductivity was observed only in certain materials below a threshold temperature, designated the "critical temperature", such threshold typically approximating absolute zero. This type of limitation obviously presents a serious drawback in the large scale development of any potential practical application resulting from superconductivity.

Very recently, however, research has given rise to the development of ne materials having superconducting properties at higher temperatures, i.e., temperatures on the order of from 70° to 90° K., or even as high as 100° K.

These materials are principally based on the rare earths, alkaline earths, transition metals and oxygen. More specifically, the most promising systems studied appear to be those based on yttrium and/or lanthanum, barium and/or strontium and/or calcium, copper and/or nickel and/or cobalt and/or manganese, and oxygen.

The mode of synthesis generally described in the literature for producing such materials entails a solid phase reaction at elevated temperatures (1,000° C.) between oxides and/or salts containing a volatile anion (for example, the carbonate) of the corresponding elements, with the latter compounds being present in the form of powders.

However, this process has the disadvantage of requiring delicate controls and the powders constituting the final product are largely inadequate in terms of their sinterability.

But, relative to certain practical applications, only the use of sintered superconducting products is of any real interest.

Therefore, it is essential that dense and homogeneous sintered materials be available which retain the intrinsic superconducting characteristics of the initial powders. Consequently, it is necessary to first have homogeneous superconducting powders that are readily and easily sintered.

SUMMARY OF THE INVENTION

Accordingly, a major object of the present invention is the provision of a simple, effective and readily applicable improved process for the reproducible production of homogeneous superconducting powders displaying excellent sinterability properties, as well as for the production of high density sintered superconducting materials therefrom.

Briefly, the present invention features a process for the preparation of finely divided superconducting and sinterable powders, comprising:

(a) intimately admixing a sol of a rare earth element and a solution of at least one alkaline earth metal nitrate and at least one nitrate of a transition metal, with the pH of the resulting mixture being adjusted to a value such that said nitrates remain in a soluble state therein;

(b) drying the resulting mixture;

(c) calcining the dried product; and, optionally;

(d) grinding the calcined material.

DETAILED DESCRIPTION OF THE PREFERRED EMBODIMENTS OF THE INVENTION

More particularly according to the present invention, the term "rare earth element" is intended to connote any element of the Periodic Table having an atomic number of from 57 to 71, as well as yttrium.

The term "yttric rare earths" connotes the heaviest elements of the rare earths, having atomic numbers beginning with samarium and terminating with lutecium, and also including yttrium.

Finally, the expression "sol" is intended to connote any system containing fine solid colloidal particles, dispersed in an aqueous phase.

In general, the sols of the rare earths employed in the present invention may be prepared by any known means, in particular by the process described in U.S. Pat. No. 3,024,199, i.e., by the thermal peptization of the hydrated oxide of the corresponding rare earth.

More especially, if sols of the rare earths of yttric type are to be prepared, a process such as that described in published French Application No. 87/12,669 is applicable.

According to this process, a rare earth oxide is first reacted, under agitation and at ambient temperature, with a controlled amount of a monovalent acid that is soluble in water and has a $pK_a$ ranging from 2.5 to 5.0, such as, for example, acetic acid, whereupon the reaction medium obtained in this manner is heated to a temperature of from 70° to 100° C. and maintained at such temperature for from 1 to 4 h, preferably 3 to 4 h.

The process described in this '669 application preferably entails the following parameters:

(i) the rare earth oxide (for example $Y_2O_3$) is present in the form of a finely divided powder of high purity (higher than 99%), the particle size of which is on the order of a few microns, said oxide having been previously calcined at a temperature of from 850° C. to 1,050° C., preferably about 950° C., for a period of time o from 2 to 4 h;

(ii) a concentrated 1 to 4 N acetic acid is used in an amount constituting a stoichiometric deficit, which signifies that the molar ratio of the acid to the rare earth oxide, expressed in terms of the metallic cation thereof, is less than 2.5, preferably about 1.5; and (iii) any unreacted rare earth oxide is eliminated by filtration, decantation or centrifugation In a preferred embodiment of the present invention, yttrium or lanthanum sols are employed. Even more preferably, yttrium sols are used.

According to the process of the invention, a solution, in water, of at least one alkaline earth metal nitrate and at least one nitrate of a transition metal is admixed into the sol.

The principal alkaline earth metal nitrate suitable for use in the present invention are the nitrates of calcium, barium and strontium.

The transition metal nitrates are advantageously selected from among the nitrates of copper, nickel, manganese, cobalt and iron.

The selection of the particular sols and nitrates from among those mentioned above will be a function of the nature and composition of the superconducting powder to be produced.

Similarly, the proportions of the different starting material compounds are adjusted in a conventional manner as a function of the stoichiometry desired in the final product, which obviously should correlate with the ultimate realization of superconducting properties.

The process according to the invention is thus particularly applicable to the preparation of superconducting systems of the Y—Ba—Cu—O type. These systems were studied, in particular, in the *Journal of the American Chemical Society*, 109, 2528–2530 (1987).

In an essential embodiment of the invention, the initial solution of nitrates is first acidified, advantageously by means of nitric or acetic acid, whereupon the sol of the rare earth is added to said acidified solution, and with the amount of acid introduced into the nitrate solution being sufficient to provide, after the addition of the sol, a final pH lower than the pH of precipitation of the nitrates in the mixture.

For example, in the case of yttrium sol/barium nitrate/copper nitrate system, this critical value of pH is about 4.1.

The mixture obtained in this manner contains approximately 10 to 30% by weight of dry solids. It must then be dried.

Drying is accomplished by any known means, in particular by atomization, i.e., by pulverizing the solution in a hot atmosphere. Compare the text by Masters entitled *SPRAY DRYING* (Second Edition, George Godwin Publisher, London (1976)). The drying process is preferably conducted in a "flash" reactor, for example of the type developed by the assignee hereof and described specifically in FR 2,257,326, 2,419,754 and 2,431,321. In this case, the treatment gases flow helically and define a vortex. The mixture is injected in a path coinciding with the axis of symmetry of the helicoidal paths of the gases, which makes it possible to transfer perfectly the momentum of the gases to said mixture. The gases thus perform a dual function: on the one hand, that of the pulverization, i.e., the transformation of the suspension into fine droplets, and on the other, the drying of the resulting droplets. Furthermore, the retention time of the particles in the reactor is extremely short, less than approximately 1/10 of a second, which eliminates any risk of overheating due to an overly lengthy contact with the gases.

Depending on the respective flow rates of the gases and the mixture, the inlet temperature of the gases ranges from 600° to 900° C., preferably from 700° to 900°, and the outlet temperature of the dried solids ranges from 100. to 300° C., preferably from 150° to 250° C.

A dry product having a grain size distribution on the order of a few microns, for example from 1 to 10 microns, is thus produced The product is then calcined.

The calcination is carried out at a temperature of from 700° to 1,000° C., preferably from 800° to 900° C.

The duration of the calcination may vary from 30 min to 24 h, for example, and preferably from 5 to 15 h.

This calcination is carried out under an atmosphere of air, or any mixture of air and oxygen, but preferably in air.

In a preferred embodiment of the invention, the calcined materials are cooled very rapidly to ambient temperature, which is equivalent to quenching, for example by a stream of cold air.

The cooling time is generally on the order of a few seconds.

Following this calcination, a superconducting powder having a macroscopic grain size distribution of approximately 1 to 10 microns is obtained, with the 1 to 10 micron grains consisting of elementary crystals of a size of from about 100 to 600.

The powders obtained must be ground, preferably dry, such as to enable good and effective sintering. The mean grain size distribution of the powders then ranges from about 0.5 to 2 microns, preferably from 1 to 2 microns.

The resulting superconducting powders have the notable property of ready conversion, after sintering, into perfectly homogeneous sintered superconducting materials, having a density higher than 96% of the theoretical density of the material under consideration.

The sintering temperature of the powders ranges from 900° to 1,000° C. and the sintering time generally ranges from 2 to 10 h. The sintering is preferably carried out under an oxygen atmosphere.

More specifically, the characteristics of the superconducting powders according to the invention relative to their sinterability, are determined as follows:

The powder is first pelleted with or without a binder, under a uniaxial pressure of 1.5 T/cm$^2$, then sintered for 2 h at a temperature of 950° C and cooled for 7 h to ambient temperature; the density of the product obtained is then measured. In all cases, a final density higher than 95% of the theoretical density of the material under consideration is obtained.

It is further observed that the sintered material has very good superconducting properties.

In order to further illustrate the present invention and the advantages thereof, the following specific example is given, it being understood that same is intended only as illustrative and in nowise limitative.

EXAMPLE

This example illustrates the preparation of a superconducting material of the formula Y—Ba$_2$—Cu$_3$—O$_x$ ($6.5 \leq x \leq 7$) according to the invention.

(A) Preparation of the powder:

In 800 ml water at 70° C., 76.8 g barium nitrate and 106.6 g copper nitrate were dissolved.

The solution was acidified with 27 ml concentrate acetic acid.

Subsequently, under agitation, 100 ml of a concentrated yttrium sol with 166 g/l yttrium oxide were introduced into the mixture. The sol was prepared by a process such as described in French Patent No. 87/12,669.

After homogenization, the solution obtained was dried by atomization.

Drying was carried out in a "flash" type reactor described in FR 2,257,326, 2,419,754 and 2,431,321.

The inlet temperature of the gases was 800.C and their outlet temperature was 200.C.

The powder obtained after drying was then calcined at 850° C. in air, for a time of from 10 to 15 h.

Dry grinding of the powder was then carried out, until a powder having a grain size distribution of less than 2 micron was obtained.

The characteristics of the resulting powder were the following:

| (i) | Specific (BET) surface | 3 m²/g |
|---|---|---|
| (ii) | Total pore volume | 0.38 cm³/g |
| (iii) | Actual pore volume | 0.28 cm³/g |
| (iv) | Intergranular volume | 0.10 cm³/g |
| (v) | Pore size range | 0.02-10 micron |
| (vi) | Mean pore diameter | 0.6 micron |
| (vii) | Mean grain size | 1.3 micron |
| (viii) | Mean crystallite size | approx. 400 Å |

The grain size distribution of the grains was the following ($\phi$=diameter):

| $\phi > 4$ micron | 20% |
|---|---|
| 0.7 micron $< \phi < 4$ micron | 60% |
| $\phi < 0.7$ micron | 20% |

(B) Sintering of the powder:

The powder was pelleted by dry, uniaxial pressing, under a pressure of 1.5 T/cm², then sintered at 950° C. for 2 h under oxygen and then cooled for 7 h to ambient temperature.

A material having a density equal to 96% of the theoretical density was produced.

The material was superconducting. Its temperature of "onset" of transition was 92 K and it had the average formula of $Y-Ba_2-CU_3-O_{6.9}$.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims, including equivalents thereof.

What is claimed is:

1. A process for the production of a finely divided superconducting powder of at least one rare earth element, at least one alkaline earth metal, at least one transition metal, and oxygen, comprising (a) intimately admixing a sol of a rare earth element and a solution of at least one alkaline earth metal nitrate and of at least one nitrate of a transition metal, with the pH of the resulting mixture being adjusted to a value such that said nitrates remain solubilized therein; (b) drying the resulting mixture; (c) calcining the dried product; and, optionally; (d) grinding the calcined material.

2. The process as defined by claim 1, wherein the pH is adjusted by adding nitric or acetic acid.

3. The process as defined by claim 2, wherein the addition is to said nitrate solution.

4. The process as defined by claim 1, wherein said drying is by atomization.

5. A process for the production of a finely divided superconducting powder of at least one rare earth element, at least one alkaline earth metal, at least one transition metal, and oxygen, comprising (a) intimately admixing a sol of a rare earth element and a solution of at least one alkaline earth metal nitrate and of at least one nitrate of a transition metal, with the pH of the resulting mixture being adjusted to a value such that said nitrates remain solubilized therein; (b) drying the resulting mixture; (c) calcining the dried product; and, optionally; (d) grinding the calcined material, the drying comprising atomization, said atomization comprising injecting said solution into the axis of symmetry of a helicoidal flow of hot gases to establish a vortex, whereby effecting pulverization and drying, with the retention time of the particulates in such reaction zone being less than about 1/10 sec.

6. The process as defined by claim 5, wherein the inlet temperature of said hot gases ranges from 600° to 900° C.

7. The process as defined by claim 6, wherein said inlet temperature ranges from 700° to 900° C.

8. The process as defined by claim 6, wherein the outlet temperature of the dried solids ranges from 100° to 300°C.

9. The process as defined by claim 8, wherein said outlet temperature ranges from 150° to 250° C.

10. The process as defined by claim 1, wherein said calcination is carried out at a temperature of from 700° to 1,000° C.

11. The process as defined by claim 10, said calcination temperature ranging from 800° to 900° C.

12. The process as defined by claim 1, comprising conducting said calcination in air.

13. The process as defined by claim 1, comprising quenching cooling said calcined product to ambient temperature.

14. The process as defined by claim 1, comprising grinding under dry conditions.

15. The process as defined by claim 14, wherein said grinding is to such extent as to reduce the particle size of the calcined product to a mean grain size distribution of less than 2 microns.

16. The process as defined by claim 1, said at least one alkaline earth metal nitrate comprising a nitrate of calcium, strontium and/or barium.

17. The process as defined by claim 16, said at least one nitrate of a transition metal comprising a nitrate of copper, nickel, manganese, cobalt and/or iron.

18. A process for the production of a finely divided superconducting powder of at least one rare earth element, at least one alkaline earth metal, at least one transition metal, and oxygen, comprising (a) intimately admixing a sol of a rare earth element and a solution of barium nitrate and copper nitrate, with the pH of the resulting mixture being adjusted to a value such that said nitrates remain solubilized therein; (b) drying the resulting mixture; (c) calcining the dried product; and, optionally; (d) grinding the calcined material.

19. The process as defined by claim 18, comprising admixing a sol of yttrium.

20. The process as defined by claim 1, wherein the sol contains fine solid colloidal particles dispersed in an aqueous phase.

21. The process as defined by claim 1, wherein the sol is prepared by thermal peptization of a hydrated oxide of a rare earth element.

22. The process as defined by claim 1, wherein the sol is prepared by reacting a rare earth oxide with a monovalent acid that is soluble in water thereby forming a reaction medium.

23. A process for the production of a finely divided superconducting powder of at least one rear earth element, at least one alkaline earth metal, at least one transition metal, and oxygen, comprising (a) intimately admixing a sol of a rare earth element and a solution of at least one alkaline earth metal nitrate and of at least one nitrate of a transition metal, with the pH of the resulting mixture being adjusted to a value such that said nitrates remain solubilized therein; (b) drying the resulting mixture; (c) calcining the dried product; and, optionally; (d) grinding the calcined material, the transition metal comprising copper.

24. A process for the production of a finely divided superconducting powder of at least one rare earth element, at least one alkaline earth metal, at least one transition metal, and oxygen, comprising (a) intimately admixing a sol of a rare earth element and a solution of at least one alkaline earth metal nitrate and of at least one nitrate of a transition metal, with the pH of the resulting mixture being adjusted to a value such that said nitrates remain solubilized therein; (b) drying the resulting mixture; (c) calcining the dried product; and, optionally; (d) grinding the calcined material, the sol being prepared by reacting a rare earth oxide with acetic acid.

25. The process as defined by claim 22, wherein the reaction medium is heated to 70° to 100° for 1 to 4 hours.

26. The process as defined by claim 1, wherein a final pH in step (a) is lower than a pH of precipitation of the nitrates in the mixture.

27. The process as defined by claim 1, wherein precipitation of the rare earth element, the transition metal and the alkaline earth metal is avoided in step (a).

* * * * *